(12) United States Patent
Wang et al.

(10) Patent No.: US 12,125,824 B2
(45) Date of Patent: Oct. 22, 2024

(54) SEMICONDUCTOR STACK STRUCTURE AND MANUFACTURING METHOD THEREOF

(71) Applicant: Taiwan Semiconductor Manufacturing Company, Ltd., Hsinchu (TW)

(72) Inventors: Chuei-Tang Wang, Taichung (TW); Chien-Yuan Huang, Hsinchu (TW); Shih-Chang Ku, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 52 days.

(21) Appl. No.: 17/855,726

(22) Filed: Jun. 30, 2022

(65) Prior Publication Data

US 2024/0006379 A1 Jan. 4, 2024

(51) Int. Cl.
*H01L 25/065* (2023.01)
*H01L 23/00* (2006.01)

(52) U.S. Cl.
CPC .......... *H01L 25/0655* (2013.01); *H01L 24/89* (2013.01); *H01L 2224/80894* (2013.01)

(58) Field of Classification Search
CPC ............. H01L 25/0652; H01L 25/0655; H01L 2224/80894; H01L 2224/80896; H01L 23/147
See application file for complete search history.

(56) References Cited

U.S. PATENT DOCUMENTS

| | | | |
|---|---|---|---|
| 2020/0402913 A1* | 12/2020 | Delacruz | H01L 23/5385 |
| 2021/0159160 A1* | 5/2021 | Chen | H01L 23/49838 |
| 2023/0092429 A1* | 3/2023 | Dutta | H01G 4/40 257/301 |
| 2023/0145518 A1* | 5/2023 | Chiu | H01L 24/05 257/773 |

* cited by examiner

*Primary Examiner* — Tucker J Wright
(74) *Attorney, Agent, or Firm* — JCIPRNET

(57) ABSTRACT

Disclosed are a semiconductor stack structure and a manufacturing method of a semiconductor stack structure. In one embodiment, the semiconductor stack structure includes a first semiconductor element, a second semiconductor element side-by-side bonded to the first semiconductor element through a direct bonding manner and a third semiconductor element, wherein the first semiconductor element and the second semiconductor element are bonded on the third semiconductor element.

20 Claims, 3 Drawing Sheets

1A

SEMICONDUCTOR STACK STRUCTURE AND MANUFACTURING METHOD THEREOF

BACKGROUND

Miniaturization of semiconductor devices is the current trend. As such, improvements to reduce distances between semiconductor elements are still needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

Figure 1A:
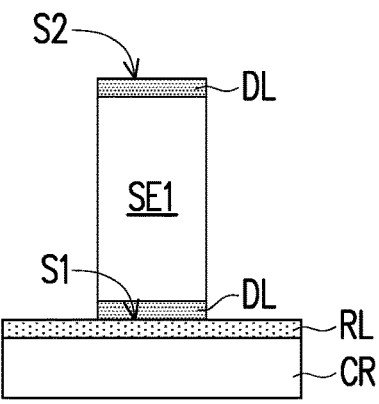
FIG. 1A through FIG. 1E schematically illustrate a process flow for manufacturing a semiconductor stack structure in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Stack of semiconductor elements is one of the commonly used solutions to achieve size miniaturization or other purposes. When bonding a plurality of semiconductor elements onto the same element, the plurality of semiconductor elements are expected to be closely bonded to each other to increase the number of semiconductor elements per unit area or to reduce the area in which a desired number of semiconductor elements are arranged. Unfortunately, in practice, gaps are created between the plurality of semiconductor elements due to process limitations, tolerances, errors, or the like. These gaps need to be filled with gap-filling material to facilitate the formation or disposition of other elements subsequently formed thereon. However, if the thermal conductivity of the gap-filling material is worse than those of the semiconductor elements, the overall heat dissipation effect will be reduced. In addition, when the semiconductor elements are thick, a gap-filling material with a larger aspect ratio needs to be selected from the existing gap-filling materials to facilitate filling these gaps, and the limitation of the gap-filling material reduces the design flexibility of the stack of semiconductor elements.

The present disclosure is related to a semiconductor stack structure and a manufacturing method thereof. In some embodiments, the semiconductor elements are side-by-side bonded (horizontal bonding, e.g., bonded along direction X and/or Y) before vertically bonded (e.g., bonded along direction Z) to another semiconductor element. The horizontal and vertical stack of the semiconductor elements enables the plurality of semiconductor elements to be bonded in various manners in three dimensions (directions X, Y and Z), thereby enabling greater design flexibility. In some embodiments, the horizontal bonding and vertical bonding of the semiconductor elements are direct bonding, such as a fusion bonding, a hybrid bonding or the like. The direct bonding helps to reduce the distance between adjacent semiconductor elements by reducing the bond thickness thereby contributing to increase in density of semiconductor element arrangement, miniaturization of the overall size of the semiconductor stack structure, and/or heat dissipation improvement. In addition, the gap-filling material can be omitted by directly bonding semiconductor elements. Accordingly, the limitation or impact of the gap-filling material on the design flexibility and the overall heat dissipation performance of the semiconductor stack can be improved.

Figure 2:
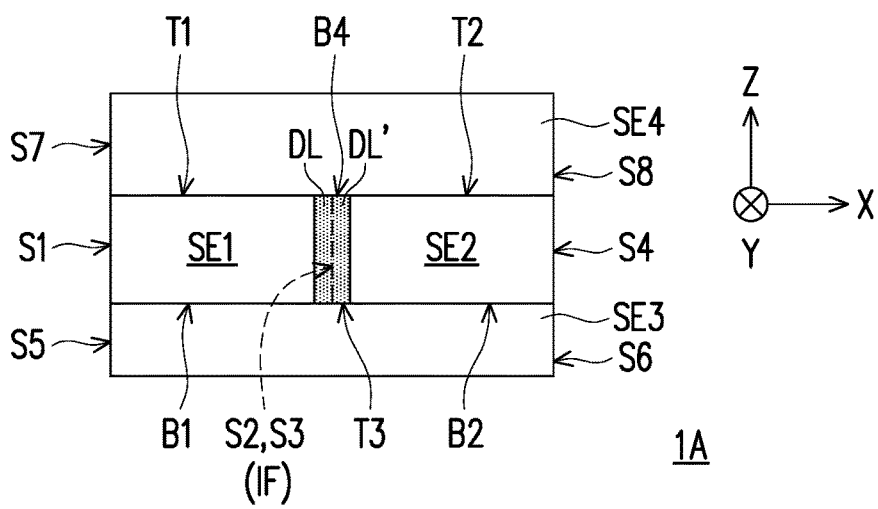
FIG. 2 through FIG. 4 schematically illustrate various semiconductor stack structures in accordance with other embodiments of the present disclosure.
Figure 3:
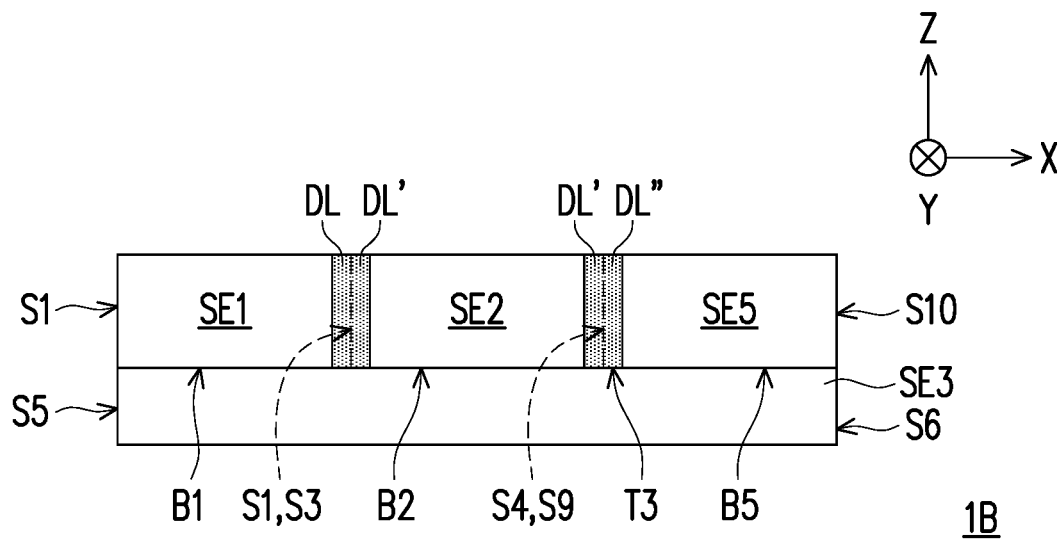
Figure 4:
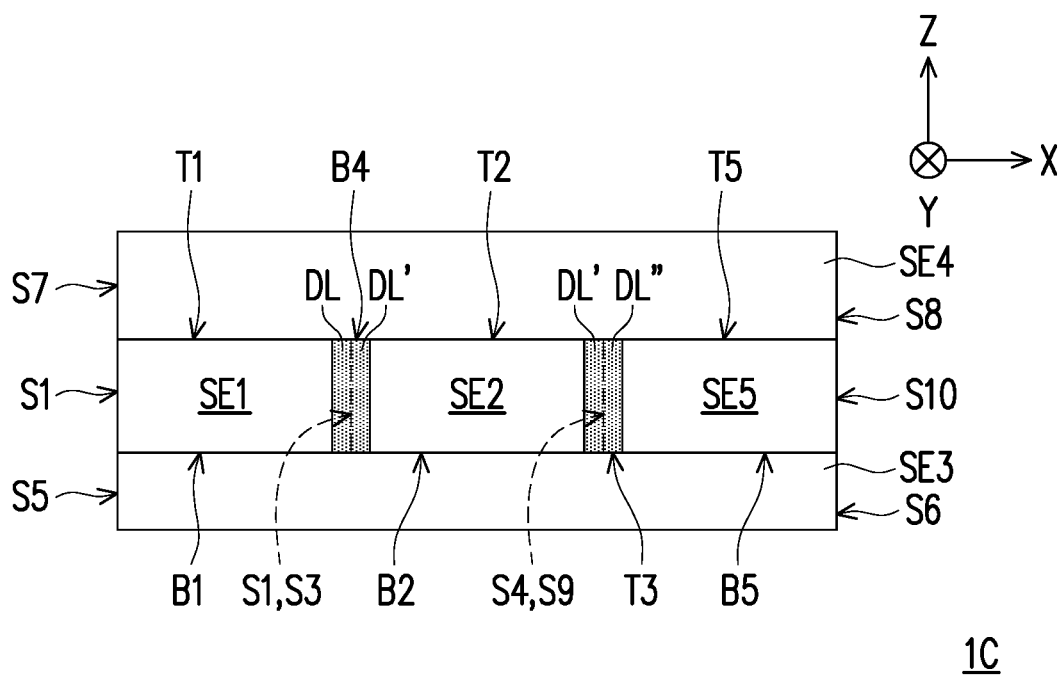

FIG. 1A through FIG. 1E schematically illustrate a process flow for manufacturing a semiconductor stack structure in accordance with some embodiments of the present disclosure. FIG. 2 through FIG. 4 schematically illustrate various semiconductor stack structures in accordance with other embodiments of the present disclosure.

Referring to FIG. 1A through FIG. 1E, a manufacturing method of a semiconductor stack structure in accordance with some embodiments of the present disclosure is provided. The manufacturing method may include: bonding a first semiconductor element SE1 and a second semiconductor element SE2 side-by side (e.g., refer to FIG. 1A through FIG. 1C); and bonding the bonded first semiconductor element SE1 and second semiconductor element SE2 on a third semiconductor element SE3 (e.g., refer to FIG. 1D).

Specifically, as shown in FIG. 1A, bonding the first semiconductor element SE1 and the second semiconductor element SE2 side-by side may include attaching the first semiconductor element SE1 having a first sidewall surface S1 and a second sidewall surface S2 opposite to the first sidewall surface S1 to a carrier CR with the first sidewall surface S1 facing the carrier CR. For example, the first semiconductor element SE1 may be disposed on the carrier CR by a pick-and-place process, wherein the first semiconductor element SE1 rotated 90 degrees is placed upright on the carrier CR.

The carrier CR may include any suitable material that could provide structural support during semiconductor processing. In some embodiments, the material of the carrier CR includes metal (e.g., steel), glass, ceramic, silicon (e.g., bulk silicon), combinations thereof, multi-layers thereof, or the like, but other materials of the carrier CR are within the contemplated scope of the disclosure.

In some embodiments, attaching the first semiconductor element SE1 to the carrier CR includes temporarily fixing the first semiconductor element SE1 on the carrier CR through a release layer RL. The release layer RL may be optionally formed on the carrier CR for bonding and de-bonding the carrier CR from the structure subsequently formed thereon (e.g., the first semiconductor element SE1 and the second semiconductor element SE2). In some embodiments, the release layer RL includes a layer of light-to-heat-conversion (LTHC) release coating and a layer of associated adhesive (such as an ultra-violet (UV) curable adhesive or a heat curable adhesive layer) or the like, but other materials of the release layer RL are within the contemplated scope of the disclosure.

The first semiconductor element SE1 may include a semiconductor die, but other kinds of semiconductor elements are within the contemplated scope of the disclosure. The semiconductor die may include memory, flash, power chip, power module, converter, sensor, logic die and so on that can work in conjunction with other semiconductor elements (e.g., the second semiconductor element SE2 and the third semiconductor element SE3) in order to provide a desired functionality to the user. In some embodiments, the first semiconductor element SE1 includes a digital die, an analog die, a mixed signal die, such as application-specific integrated circuit (ASIC) die, a logic die, a sensor die or other kinds of integrated circuit dies, but is not limited thereto.

In some embodiments, the first semiconductor element SE1 is an integrated circuit die that includes a semiconductor substrate (not shown), an interconnection structure (not shown) formed on the semiconductor substrate, a passivation layer (not shown) formed on the interconnection structure, a plurality of conductive pads (not shown) formed on the passivation layer and electrically connected to the interconnection structure, a post passivation layer (not shown) covering the passivation layer and the conductive pads, and a plurality of conductive connectors (not shown) formed on the post passivation layer and electrically connected to the conductive pads.

The semiconductor substrate may be a silicon substrate including active components (e.g., diodes, transistors or the like) and passive components (e.g., resistors, capacitors, inductors or the like) formed therein. The interconnection structure may include a plurality of interconnect wiring layers and a plurality of dielectric layers stacked alternately. The passivation layer covers the interconnection structure and includes a plurality of contact openings such that the topmost interconnect wiring layers of the interconnection structure are exposed through the contact openings of the passivation layer. In some embodiments, the passivation layer is a silicon oxide layer, a silicon nitride layer, a silicon oxy-nitride layer or a dielectric layer formed by other suitable dielectric materials. The conductive pads are formed in the contact openings of the passivation layer and electrically connected to the topmost interconnect wiring layers of the interconnection structure through the contact opening of the passivation layer. In some embodiments, the conductive pads are aluminum pads, copper pads or other suitable metal pads. The post passivation layer may include a plurality of contact openings such that the conductive pads are partially exposed by the contact openings of the post passivation layer. In some embodiments, the post passivation layer is a polyimide (PI) layer, a polybenzoxazole (PBO) layer, or a dielectric layer formed by other suitable polymers. The conductive connectors are formed in the contact openings of the post passivation layer and electrically connected to the conductive pads through the contact opening of the post passivation layer. The integrated circuit die may be electrically connected to other semiconductor elements (e.g., the third semiconductor element SE3) through the conductive connectors. In some embodiments, the conductive connectors are plated copper connectors, copper alloy connectors or other suitable conductive connectors. In some embodiments, top surfaces of the conductive connectors are substantially level with a top surface of the post passivation layer.

In some embodiments, the surface where the conductive connectors are distributed on is referred to as an active surface of the integrated circuit die, the surface opposite to the active surface of the integrated circuit die is referred to as a rear surface of the integrated circuit die, and surface(s) connected between the active surface and the rear surface of the integrated circuit die may be referred to as sidewall surface(s). Namely, the first sidewall surface S1 and the second sidewall surface S2 are surfaces of the first semiconductor element SE1 that are connected between the active surface and the rear surface of the first semiconductor element SE1.

In some embodiments, as shown in FIG. 1A, the first sidewall surface S1 and the second sidewall surface S2 are dielectric sidewall surfaces. For example, a dielectric layer DL may remain on edges of the first semiconductor element SE1 after the first semiconductor element SE1 is singulated from a semiconductor wafer (not shown). Specifically, the semiconductor wafer is attached to a tape frame (not shown) which holds the semiconductor wafer in place during the singulation process. Subsequently, a cutting or singulation process may be performed on the semiconductor wafer. For example, a mechanical saw, laser saw, or other suitable tool is used to cut across the semiconductor wafer along scribe lines (e.g., a series of cross lines along directions X and Y), so that several semiconductor dies (or integrated circuit dies) are separated, or singulated, from each other. In some embodiments, the dielectric layer DL includes a silicon oxide layer, a silicon nitride layer, a silicon oxy-nitride layer or a dielectric layer formed by other suitable dielectric materials.

In some embodiments, the first sidewall surface S1 of the first semiconductor element SE1 is attached to the release layer RL through a die attach film (DAF; not shown). The die attach film may be attached to the first sidewall surface S1 of the first semiconductor element SE1 before the pick-and-place process. Alternatively, the die attach film is omitted.

Figure 1B:
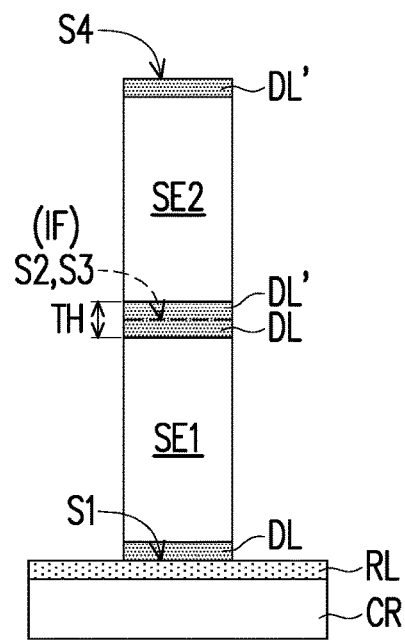

As shown in FIG. 1B, bonding the first semiconductor element SE1 and the second semiconductor element SE2 side-by side may further include bonding a third sidewall surface S3 of the second semiconductor element SE2 to the second sidewall surface S2 of the first semiconductor element SE1.

For example, the second semiconductor element SE2 may be disposed on the first semiconductor element SE1 by a pick-and-place process, wherein the second semiconductor element SE2 rotated 90 degrees is placed upright on the upright first semiconductor element SE1.

The second semiconductor element SE2 may include a semiconductor die, but other kinds of semiconductor elements are within the contemplated scope of the disclosure. The semiconductor die may include memory, flash, power chip, power module, converter, sensor, logic die and so on that can work in conjunction with other semiconductor elements (e.g., the first semiconductor element SE1 and the third semiconductor element SE3) in order to provide a desired functionality to the user. In some embodiments, the second semiconductor element SE2 includes a digital die, an analog die, a mixed signal die, such as application-specific integrated circuit die, a logic die, a sensor die or other kinds of integrated circuit dies, but is not limited thereto.

In some embodiments, the second semiconductor element SE2 is also an integrated circuit die similar to the first semiconductor element SE1 described in FIG. 1A, so the detailed descriptions are not repeated for brevity. According to some embodiments, the first semiconductor element SE1 and the second semiconductor element SE2 may be the same type of integrated circuit dies. According to some alternative embodiments, the first semiconductor element SE1 and the second semiconductor element SE2 may be different types of integrated circuit dies.

As shown in FIG. 1B, the second semiconductor element SE2 further has a fourth sidewall surface S4 opposite to the third sidewall surface S3. In some embodiments, the third sidewall surface S3 and the fourth sidewall surface S4 are dielectric sidewall surfaces. For example, a dielectric layer DL' may remain on edges of the second semiconductor element SE2 after the second semiconductor element SE2 is singulated from a semiconductor wafer (not shown). The semiconductor wafer from which the second semiconductor element SE2 is singulated may be different from the semiconductor wafer from which the first semiconductor element SE1 is singulated when the first semiconductor element SE1 and the second semiconductor element SE2 are different types of integrated circuit dies. On the other hand, the semiconductor wafer from which the second semiconductor element SE2 is singulated may be the same as the semiconductor wafer from which the first semiconductor element SE1 is singulated when the first semiconductor element SE1 and the second semiconductor element SE2 are the same type of integrated circuit dies, but is not limited thereto. In some embodiments, the dielectric layer DL' includes a silicon oxide layer, a silicon nitride layer, a silicon oxynitride layer or a dielectric layer formed by other suitable dielectric materials. In addition, the dielectric layer DL and the dielectric layer DL' may be formed by the same or different dielectric materials.

In some embodiments, the second semiconductor element SE2 can be side-by-side bonded to the first semiconductor element SE1 through a direct bonding manner. For example, the third sidewall surface S3 may be bonded to the second sidewall surface S2 without an adhesive layer, and the third sidewall surface S3 may be in direct contact with the second sidewall surface S2.

When the second sidewall surface S2 and the third sidewall surface S3 are dielectric sidewall surfaces (e.g., oxide sidewall surfaces), the third sidewall surface S3 may be bonded to the second sidewall surface S2 through a fusion bonding process (e.g., oxide-to-oxide bonding process). In some embodiments, a bond thickness TH of a dielectric interface (i.e., total thickness of the dielectric layer DL and the dielectric layer DL' at the interface IF) of the first semiconductor element SE1 and the second semiconductor element SE2 is equal to or less than 20 µm.

When the dielectric layer DL/the dielectric layer DL' is not existed on edges of the first semiconductor element SE1/the second semiconductor element SE2 after the first semiconductor element SE1/the second semiconductor element SE2 is singulated from the semiconductor wafer, the third sidewall surface S3 may be bonded to the second sidewall surface S2 through a hybrid bonding process (metal-to-metal direct bonding and oxide-to-oxide bonding). The hybrid bonding may include a pre-bonding and an anneal to facilitate metals at interface IF of the first semiconductor element SE1 and the second semiconductor element SE2 inter-diffuse with the corresponding metals.

Figure 1C:
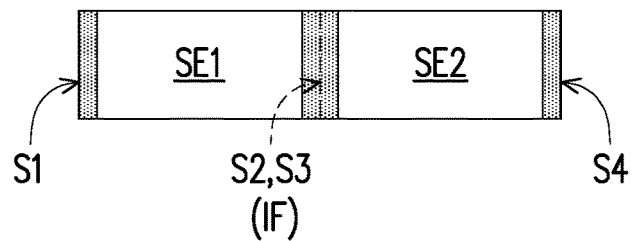

As shown in FIG. 1C, bonding the first semiconductor element SE1 and the second semiconductor element SE2 side-by side may further include detaching the first sidewall surface S1 of the first semiconductor element SE1 from the carrier CR. In some embodiments, detaching the first sidewall surface S1 of the first semiconductor element SE1 from the carrier CR includes removing the release layer RL by a heating or light illumination process. For example, an external energy such as UV laser, visible light or heat, is applied to the release layer RL to lose its adhesiveness, so that the first semiconductor element SE1 along with the second semiconductor element SE2 bonded thereto may be detached from the carrier CR. The die attach film described above (not shown, if existed) is optionally removed during or after removing the carrier CR.

Figure 1D:
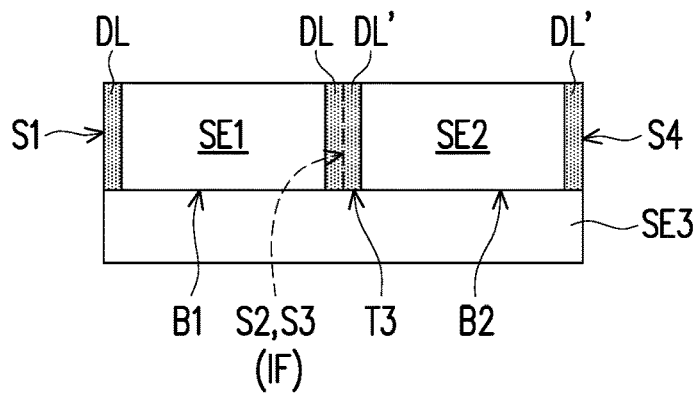

As shown in FIG. 1D, the bonded first semiconductor element SE1 and second semiconductor element SE2 are then rotated 90 degrees and bonded on the third semiconductor element SE3. For example, the bonded first semiconductor element SE1 and second semiconductor element SE2 may be disposed on the third semiconductor element SE3 by a pick-and-place process, wherein the bonded first semiconductor element SE1 and second semiconductor element SE2 rotated 90 degrees is placed horizontally on the third semiconductor element SE3.

The third semiconductor element SE3 may be any kind of wafer form or chip form semiconductor element. For example, the third semiconductor element SE3 may be an interposer formed based on a semiconductor substrate, with through-silicon vias formed in the semiconductor substrate to interconnect the features formed on the opposite sides of the interposer, but is not limited thereto. Alternatively, the third semiconductor element SE3 may be a silicon-substrate-free interposer or a Si-less interposer, wherein the silicon substrate is replaced by dielectric layers, and stacked vias and through-dielectric vias are formed in dielectric layers to replace through-silicon vias. In some alternative embodiments, the third semiconductor element SE3 is a bulk substrate (e.g., a silicon substrate), a printed circuit board (PCB), a printed wiring board, a package substrate, additional semiconductor package, or other semiconductor element that is capable of carrying the semiconductor elements, providing mechanical support or serving as a heat spreader.

In some embodiments, bottom surfaces (e.g., bottom surface B1 and bottom surface B2) of the first semiconductor element SE1 and the second semiconductor element SE2 are bonded to a top surface T3 of the third semiconductor element SE3 through a direct bonding manner, such as a fusion bonding manner, a hybrid bonding manner, an anodic bonding or other direct bonding manner that is chosen according to the material type of the surfaces to be bonded, but is not limited thereto.

For example, when the first semiconductor element SE1 and the second semiconductor element SE2 are bonded to the third semiconductor element SE3 for electrical connection (e.g., when the first semiconductor element SE1 and the second semiconductor element SE2 are integrated circuit dies and the third semiconductor element SE3 is an interposer), the bottom surfaces (e.g., bottom surface B1 and bottom surface B2) of the first semiconductor element SE1 and the second semiconductor element SE2 may be active surfaces of the first semiconductor element SE1 and the second semiconductor element SE2, and the bottom surfaces (e.g., bottom surface B1 and bottom surface B2) may be bonded to the top surface T3 through the hybrid bonding manner.

On the other hand, when the first semiconductor element SE1 and the second semiconductor element SE2 are bonded to the third semiconductor element SE3 for mechanical support (e.g., when the first semiconductor element SE1 and the second semiconductor element SE2 are integrated circuit dies and the third semiconductor element SE3 is a bulk substrate), the bottom surfaces (e.g., bottom surface B1 and bottom surface B2) of the first semiconductor element SE1 and the second semiconductor element SE2 may be rear surfaces of the first semiconductor element SE1 and the second semiconductor element SE2, and the bottom surfaces (e.g., bottom surface B1 and bottom surface B2) may be bonded to the top surface T3 through the anodic bonding manner.

In some alternative embodiments, the first semiconductor element SE1 and the second semiconductor element SE2 are bonded to the third semiconductor element SE3 through thermal interface material (TIM) adhesion. The thermal interface material is an adhesive having a high thermal conductivity, for example, higher than about 1 W/k*m or higher than about 5 W/k*m, but is not limited thereto.

Figure 1E:
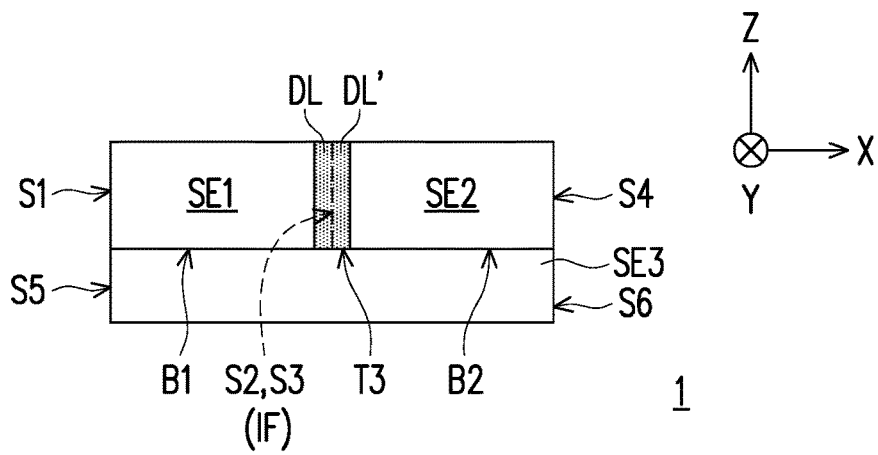

As shown in FIG. 1E, the manufacturing method of the semiconductor stack structure may optionally include dicing outer edges of the bonded first semiconductor element SE1, second semiconductor element SE2 and third semiconductor element SE3 to remove the remained sidewall dielectric and the third semiconductor element SE3 thereunder (e.g., the dielectric layer DL and the dielectric layer DL' at the outer edges and the third semiconductor element SE3 under the dielectric layer DL and the dielectric layer DL'). For example, a mechanical saw, laser saw, or other suitable tool can be used to cut across the bonded first semiconductor element SE1, second semiconductor element SE2 and third semiconductor element SE3 to form a semiconductor stack structure 1. In this way, the first sidewall surface S1 and the second sidewall surface S2 have different configurations (e.g., with and without the dielectric layer DL), the third sidewall surface S3 and the fourth sidewall surface S4 have different configurations (e.g., with and without the dielectric layer DL'), and the first sidewall surface S1 and the fourth sidewall surface S4 are respectively aligned with sidewall surfaces (e.g., sidewall surface S5 and sidewall surface S6) of the third semiconductor element SE3.

In some alternative embodiments, the dicing step shown in FIG. 1E is omitted. In this way, the first sidewall surface S1 and the second sidewall surface S2 have the same configuration (e.g., with the dielectric layer DL), the third sidewall surface S3 and the fourth sidewall surface S4 have the same configuration (e.g., with the dielectric layer DL'), and an area of an orthogonal projection of the bonded first sidewall surface S1 and second sidewall surface S2 on the third semiconductor element SE3 may be smaller than or equal to an area of the third semiconductor element SE3.

The semiconductor stack structure 1 in accordance with some embodiments of the present disclosure may include the first semiconductor element SE1, the second semiconductor element SE2 side-by-side bonded to the first semiconductor element SE1 through a direct bonding manner (e.g., a fusion bonding manner, a hybrid bonding manner or the like) and the third semiconductor element SE3, wherein the first semiconductor element SE1 and the second semiconductor element SE2 are bonded on the third semiconductor element SE3. For example, the first semiconductor element SE1 and the second semiconductor element SE2 are bonded along the direction X, and the first semiconductor element SE1/the second semiconductor element SE2 and the third semiconductor element SE3 are bonded along the direction Z.

Note that, as shown in FIG. 1E, three semiconductor elements (the first semiconductor element SE1, the second semiconductor element SE2 and the third semiconductor element SE3) are presented for illustrative purposes; however, the number of the semiconductor elements may be more than three and the arrangement direction of the semiconductor elements (e.g., the first semiconductor element SE1 and the second semiconductor element SE2) located on the same reference plane may be altered according to needs, the disclosure is not limited thereto. In some alternative embodiments, the first semiconductor element SE1 and the second semiconductor element SE2 are bonded along the direction Y. In yet alternative embodiments, additional semiconductor element(s) may be provided and bonded on at least one side of at least one of the semiconductor elements shown in FIG. 1E. For example, three or more semiconductor elements may be side-by-side bonded along the direction X, or along the direction Y, or along both of the direction X and the direction Y to form an array, and the bonded semiconductor elements are then bonded to the third semiconductor element SE3, but is not limited thereto.

The semiconductor elements are side-by-side bonded (horizontal bonding, e.g., bonded along direction X or Y) before vertically bonded (e.g., bonded along direction Z) to another semiconductor element based on the consideration of factors such as alignment and process limits. The horizontal and vertical stack of the semiconductor elements enables the plurality of semiconductor elements to be bonded in various manners in three dimensions (directions X, Y and Z), thereby enabling greater design flexibility. In some embodiments, the horizontal bonding and vertical bonding of the semiconductor elements are direct bonding, which helps to reduce the distance between adjacent semiconductor elements by reducing the bond thickness, thereby contributing to increase in density of semiconductor element arrangement, miniaturization of the overall size of the semiconductor stack structure, and/or heat dissipation improvement. In addition, the gap-filling material can be omitted by directly bonding semiconductor elements. Accordingly, the limitation or impact of the gap-filling material on the design flexibility and the overall heat dissipation performance of the semiconductor stack can be improved.

Referring to FIG. 2, a semiconductor stack structure 1A in accordance with some embodiments of the present disclosure is provided. The semiconductor stack structure 1A further includes a fourth semiconductor element SE4 in addition to the first semiconductor element SE1, the second semiconductor element SE2 and the third semiconductor element SE3. The fourth semiconductor element SE4 is bonded on the first semiconductor element SE1 and the second semiconductor element SE2.

The fourth semiconductor element SE4 may be any kind of wafer form or chip form semiconductor element. For example, the fourth semiconductor element SE4 may be a bulk substrate (e.g., a silicon substrate) configured to provide mechanical support or serve as a heat spreader, but is not limited thereto.

In some embodiments, a bottom surface B4 of the fourth semiconductor element SE4 is bonded to top surfaces (e.g., top surface T1 and top surface T2) of the first semiconductor element SE1 and the second semiconductor element SE2 through a direct bonding manner, such as a fusion bonding manner, a hybrid bonding manner, an anodic bonding or other direct bonding manner that is chosen according to the material type of the surfaces to be bonded, but is not limited thereto. In some alternative embodiments, the fourth semiconductor element SE4 is bonded to the first semiconductor element SE1 and the second semiconductor element SE2 through thermal interface material adhesion. The thermal interface material is an adhesive having a high thermal conductivity, for example, higher than about 1 W/k*m or higher than about 5 W/k*m, but is not limited thereto.

A manufacturing method of the semiconductor stack structure 1A further includes bonding the fourth semiconductor element SE4 on the first semiconductor element SE1 and the second semiconductor element SE2 in addition to the steps shown in FIG. 1A through FIG. 1E. For example, the fourth semiconductor element SE4 may be disposed on the bonded first semiconductor element SE1 and second semiconductor element SE2 by a pick-and-place process, wherein the fourth semiconductor element SE4 is placed horizontally on the bonded first semiconductor element SE1 and second semiconductor element SE2.

In some embodiments, bonding the fourth semiconductor element SE4 on the first semiconductor element SE1 and the second semiconductor element SE2 may be subsequent to the step shown in FIG. 1E. In some alternative embodiments, bonding the fourth semiconductor element SE4 on the first semiconductor element SE1 and the second semiconductor element SE2 may be subsequent to the step shown in FIG. 1D and prior to the step shown in FIG. 1E. In this way, the outer edges of the fourth semiconductor element SE4 are also removed during or after the dicing process, and the first sidewall surface S1 and the fourth sidewall surface S4 are also respectively aligned with sidewall surfaces (e.g., sidewall surface S7 and sidewall surface S8) of the fourth semiconductor element SE4.

Referring to FIG. 3, a semiconductor stack structure 1B in accordance with some embodiments of the present disclosure is provided. The semiconductor stack structure 1B further includes a fifth semiconductor element SE5 in addition to the first semiconductor element SE1, the second semiconductor element SE2 and the third semiconductor element SE3. The fifth semiconductor element SE5 is bonded side-by-side to the second semiconductor element SE2.

The fifth semiconductor element SE5 may include a semiconductor die, but other kinds of semiconductor elements are within the contemplated scope of the disclosure. The semiconductor die may include memory, flash, power chip, power module, converter, sensor, logic die and so on that can work in conjunction with other semiconductor elements (e.g., the first semiconductor element SE1, the second semiconductor element SE2 and the third semiconductor element SE3) in order to provide a desired functionality to the user. In some embodiments, the fifth semiconductor element SE5 includes a digital die, an analog die, a mixed signal die, such as application-specific integrated circuit die, a logic die, a sensor die or other kinds of integrated circuit dies, but is not limited thereto.

In some embodiments, the fifth semiconductor element SE5 is also an integrated circuit die similar to the first semiconductor element SE1 described in FIG. 1A, so the detailed descriptions are not repeated for brevity. According to some embodiments, the first semiconductor element SE1, the second semiconductor element SE2 and the fifth semiconductor element SE5 may be the same type of integrated circuit dies. According to some alternative embodiments, the first semiconductor element SE1, the second semiconductor element SE2 and the fifth semiconductor element SE5 may be different types of integrated circuit dies.

The fifth semiconductor element SE5 may have a sidewall surface S9 and a sidewall surface S10 opposite to the sidewall surface S9. In some embodiments, the sidewall surface S9 and the sidewall surface S10 are dielectric sidewall surfaces. For example, a dielectric layer DL" may remain on edges of the fifth semiconductor element SE5 after the fifth semiconductor element SE5 is singulated from a semiconductor wafer (not shown). In some embodiments, the dielectric layer DL" includes a silicon oxide layer, a silicon nitride layer, a silicon oxy-nitride layer or a dielectric layer formed by other suitable dielectric materials. In addition, the dielectric layer DL, the dielectric layer DL' and the dielectric layer DL" may be formed by the same or different dielectric materials.

In some embodiments, the fifth semiconductor element SE5 can be side-by-side bonded to the second semiconductor element SE2 through a direct bonding manner. For example, the sidewall surface S9 may be bonded to the fourth sidewall surface S4 without an adhesive layer, and the sidewall surface S9 may be in direct contact with the fourth sidewall surface S4.

When the fourth sidewall surface S4 and the sidewall surface S9 are dielectric sidewall surfaces (e.g., oxide sidewall surfaces), the sidewall surface S9 may be bonded to the fourth sidewall surface S4 through a fusion bonding process (e.g., oxide-to-oxide bonding process). In some embodiments, a bond thickness of a dielectric interface (i.e., total thickness of the dielectric layer DL' and the dielectric layer DL" at the interface) of the second semiconductor element SE2 and the fifth semiconductor element SE5 is equal to or less than 20 μm.

When the dielectric layer DL'/the dielectric layer DL" is not existed on edges of the second semiconductor element SE2/the fifth semiconductor element SE5 after the second semiconductor element SE2/the fifth semiconductor element SE5 is singulated from the semiconductor wafer, the sidewall surface S9 may be bonded to the fourth sidewall surface S4 through a hybrid bonding process (metal-to-metal direct bonding and oxide-to-oxide bonding). The hybrid bonding may include a pre-bonding and an anneal to facilitate metals at interface of the second semiconductor element SE2 and the fifth semiconductor element SE5 inter-diffuse with the corresponding metals.

Bonding the fifth semiconductor element SE5 side-by-side to the second semiconductor element SE2 may be performed subsequent to bonding the second semiconductor element SE2 side-by-side to the first semiconductor element SE1 as shown in FIG. 1B and prior to detaching the carrier CR as shown in FIG. 1C. In addition, after the bonded first semiconductor element SE1, the second semiconductor element SE2 and fifth semiconductor element SE5 are bonded on the third semiconductor element SE3, the remained sidewall dielectric on the sidewall surface S10 side and the third semiconductor element SE3 thereunder may also be optionally removed (e.g., the dielectric layer DL" at the outer edges and the third semiconductor element SE3 under the dielectric layer DL") at the dicing step shown in FIG. 1E.

Referring to FIG. 4, a semiconductor stack structure 1C in accordance with some embodiments of the present disclosure is provided. The semiconductor stack structure 1C includes the first semiconductor element SE1, the second semiconductor element SE2, the third semiconductor element SE3, the fourth semiconductor element SE4 and the fifth semiconductor element SE5 described above, and the bottom surface B4 of the fourth semiconductor element SE4 may be bonded to top surfaces (e.g., top surface T1, top surface T2 and top surface T5) of the first semiconductor element SE1, the second semiconductor element SE2 and the fifth semiconductor element SE5 through a direct bonding manner, such as a fusion bonding manner, a hybrid bonding manner, an anodic bonding or other direct bonding manner that is chosen according to the material type of the surfaces to be bonded, but is not limited thereto. In some alternative embodiments, the fourth semiconductor element SE4 is bonded to the first semiconductor element SE1, the second semiconductor element SE2 and the fifth semiconductor element SE5 through thermal interface material adhesion.

Based on the above discussions, it can be seen that the present disclosure offers various advantages. It is understood, however, that not all advantages are necessarily discussed herein, and other embodiments may offer different advantages, and that no particular advantage is required for all embodiments.

In accordance with some embodiments of the present disclosure, a semiconductor stack structure includes a first semiconductor element, a second semiconductor element side-by-side bonded to the first semiconductor element through a direct bonding manner and a third semiconductor element, wherein the first semiconductor element and the second semiconductor element are bonded on the third semiconductor element. In some embodiments, the direct bonding manner includes a fusion bonding manner. In some embodiments, a bond thickness of a dielectric interface of the first semiconductor element and the second semiconductor element is equal to or less than 20 µm. In some embodiments, the direct bonding manner includes a hybrid bonding manner. In some embodiments, bottom surfaces of the first semiconductor element and the second semiconductor element are bonded to a top surface of the third semiconductor element through a fusion bonding manner or a hybrid bonding manner. In some embodiments, the semiconductor stack structure further includes a fourth semiconductor element bonded on the first semiconductor element and the second semiconductor element. In some embodiments, a bottom surface of the fourth semiconductor element is bonded to top surfaces of the first semiconductor element and the second semiconductor element through a fusion bonding manner, a hybrid bonding manner or an anodic bonding manner.

In accordance with some embodiments of the present disclosure, a semiconductor stack structure includes a first semiconductor element, a second semiconductor element and a third semiconductor element. The first semiconductor element has a first sidewall surface and a second sidewall surface opposite to the first sidewall surface, wherein the first sidewall surface and the second sidewall surface have different configurations. The second semiconductor element has a third sidewall surface and a fourth sidewall surface opposite to the third sidewall surface, wherein the third sidewall surface and the fourth sidewall surface have different configurations, and the third sidewall surface is bonded to the second sidewall surface. The first semiconductor element and the second semiconductor element are bonded on the third semiconductor element. In some embodiments, the second sidewall surface and the third sidewall surface are dielectric sidewall surfaces and the third sidewall surface is bonded to the second sidewall surface through a fusion bonding manner. In some embodiments, a bond thickness of a dielectric interface of the first semiconductor element and the second semiconductor element is equal to or less than 20 µm. In some embodiments, the first sidewall surface and the fourth sidewall surface are respectively aligned with sidewall surfaces of the third semiconductor element. In some embodiments, bottom surfaces of the first semiconductor element and the second semiconductor element are bonded to a top surface of the third semiconductor element through a fusion bonding manner or a hybrid bonding manner. In some embodiments, the semiconductor stack structure further includes a fourth semiconductor element bonded on the first semiconductor element and the second semiconductor element. In some embodiments, a bottom surface of the fourth semiconductor element is bonded to top surfaces of the first semiconductor element and the second semiconductor element through a fusion bonding manner, a hybrid bonding manner or an anodic bonding manner.

In accordance with alternative embodiments of the present disclosure, a manufacturing method of a semiconductor stack structure includes: bonding a first semiconductor element and a second semiconductor element side-by side; and bonding the bonded first semiconductor element and second semiconductor element on a third semiconductor element. In some embodiments, bonding the first semiconductor element and the second semiconductor element side-by side includes: attaching the first semiconductor element having a first sidewall surface and a second sidewall surface opposite to the first sidewall surface to a carrier with the first sidewall surface facing the carrier; bonding a third sidewall surface of the second semiconductor element to the second sidewall surface of the first semiconductor element; and detaching the first sidewall surface of the first semiconductor element from the carrier. In some embodiments, the second semiconductor element further has a fourth sidewall surface opposite to the third sidewall surface, wherein the first sidewall surface, the second sidewall surface, the third sidewall surface and the fourth sidewall surface are dielectric sidewall surfaces, and the third sidewall surface is bonded to the second sidewall surface through a fusion bonding process, and wherein the manufacturing method of the semiconductor stack structure further includes dicing outer edges of the bonded first semiconductor element, second semiconductor element and third semiconductor element. In some embodiments, attaching the first semiconductor element to the carrier includes temporarily fixing the first semiconductor element on the carrier through a release layer. In some embodiments, detaching the first sidewall surface of the first semiconductor element from the carrier includes removing the release layer by a heating or light illumination process. In some embodiments, the manufacturing method of the semiconductor stack structure further includes bonding a fourth semiconductor element on the first semiconductor element and the second semiconductor element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor stack structure, comprising:
a first semiconductor element;
a second semiconductor element side-by-side bonded to the first semiconductor element through a direct bonding manner, wherein a bond thickness of a dielectric interface of the first semiconductor element and the second semiconductor element is equal to or less than 20 μm; and
a third semiconductor element, wherein the first semiconductor element and the second semiconductor element are bonded on the third semiconductor element.

2. The semiconductor stack structure according to claim 1, wherein the direct bonding manner comprises a fusion bonding manner.

3. The semiconductor stack structure according to claim 1, wherein the direct bonding manner comprises a hybrid bonding manner.

4. The semiconductor stack structure according to claim 1, wherein bottom surfaces of the first semiconductor element and the second semiconductor element are bonded to a top surface of the third semiconductor element through a fusion bonding manner or a hybrid bonding manner.

5. The semiconductor stack structure according to claim 1, further comprising:
a fourth semiconductor element bonded on the first semiconductor element and the second semiconductor element.

6. The semiconductor stack structure according to claim 5, wherein a bottom surface of the fourth semiconductor element is bonded to top surfaces of the first semiconductor element and the second semiconductor element through a fusion bonding manner, a hybrid bonding manner or an anodic bonding manner.

7. A semiconductor stack structure, comprising:
a first semiconductor element having a first sidewall surface and a second sidewall surface opposite to the first sidewall surface, wherein the first sidewall surface and the second sidewall surface have different configurations;
a second semiconductor element having a third sidewall surface and a fourth sidewall surface opposite to the third sidewall surface, wherein the third sidewall surface and the fourth sidewall surface have different configurations, the third sidewall surface is bonded to the second sidewall surface, and a bond thickness of a dielectric interface of the first semiconductor element and the second semiconductor element is equal to or less than 20 μm; and
a third semiconductor element, wherein the first semiconductor element and the second semiconductor element are bonded on the third semiconductor element.

8. The semiconductor stack structure according to claim 7, wherein the second sidewall surface and the third sidewall surface are dielectric sidewall surfaces and the third sidewall surface is bonded to the second sidewall surface through a fusion bonding manner.

9. The semiconductor stack structure according to claim 7, wherein the first sidewall surface and the fourth sidewall surface are respectively aligned with sidewall surfaces of the third semiconductor element.

10. The semiconductor stack structure according to claim 7, wherein bottom surfaces of the first semiconductor element and the second semiconductor element are bonded to a top surface of the third semiconductor element through a fusion bonding manner or a hybrid bonding manner.

11. The semiconductor stack structure according to claim 7, further comprising:
a fourth semiconductor element bonded on the first semiconductor element and the second semiconductor element.

12. The semiconductor stack structure according to claim 11, wherein a bottom surface of the fourth semiconductor element is bonded to top surfaces of the first semiconductor element and the second semiconductor element through a fusion bonding manner, a hybrid bonding manner or an anodic bonding manner.

13. A manufacturing method of a semiconductor stack structure, comprising:
bonding a first semiconductor element and a second semiconductor element side-by side, wherein a bond thickness of a dielectric interface of the first semiconductor element and the second semiconductor element is equal to or less than 20 μm; and
bonding the bonded first semiconductor element and second semiconductor element on a third semiconductor element.

14. The manufacturing method of the semiconductor stack structure according to claim 13, wherein bonding the first semiconductor element and the second semiconductor element side-by side comprises:
attaching the first semiconductor element having a first sidewall surface and a second sidewall surface opposite to the first sidewall surface to a carrier with the first sidewall surface facing the carrier;
bonding a third sidewall surface of the second semiconductor element to the second sidewall surface of the first semiconductor element; and
detaching the first sidewall surface of the first semiconductor element from the carrier.

15. The manufacturing method of the semiconductor stack structure according to claim 14, wherein attaching the first semiconductor element to the carrier comprises:
temporarily fixing the first semiconductor element on the carrier through a release layer.

16. The manufacturing method of the semiconductor stack structure according to claim 15, wherein detaching the first sidewall surface of the first semiconductor element from the carrier comprises:
removing the release layer by a heating or light illumination process.

17. The manufacturing method of the semiconductor stack structure according to claim 14, wherein the second semiconductor element further has a fourth sidewall surface opposite to the third sidewall surface,
wherein the first sidewall surface, the second sidewall surface, the third sidewall surface and the fourth sidewall surface are dielectric sidewall surfaces, and the third sidewall surface is bonded to the second sidewall surface through a fusion bonding process, and
wherein the manufacturing method of the semiconductor stack structure further comprises:

dicing outer edges of the bonded first semiconductor element, second semiconductor element and third semiconductor element.

18. The manufacturing method of the semiconductor stack structure according to claim 13 further comprising:
bonding a fourth semiconductor element on the first semiconductor element and the second semiconductor element.

19. The manufacturing method of the semiconductor stack structure according to claim 18, wherein the fourth semiconductor element is bonded on the first semiconductor element and the second semiconductor element through a fusion bonding manner, a hybrid bonding manner or an anodic bonding manner.

20. The manufacturing method of the semiconductor stack structure according to claim 13, wherein the first semiconductor element and second semiconductor element are bonded on the third semiconductor element through a fusion bonding manner or a hybrid bonding manner.

* * * * *